United States Patent
Shibayama

(10) Patent No.: US 6,985,396 B2
(45) Date of Patent: Jan. 10, 2006

(54) SEMICONDUCTOR INTEGRATED CIRCUIT

(75) Inventor: Akinori Shibayama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 104 days.

(21) Appl. No.: 10/619,578

(22) Filed: Jul. 16, 2003

(65) Prior Publication Data

US 2004/0013015 A1 Jan. 22, 2004

(30) Foreign Application Priority Data

Jul. 16, 2002 (JP) .................... 2002-206424

(51) Int. Cl.
*G11C 7/00* (2006.01)

(52) U.S. Cl. .................. 365/225.7; 365/230.03; 365/189.09

(58) Field of Classification Search ............. 365/225.7, 365/230.03, 289.09, 198, 189.09; 709/244
See application file for complete search history.

(56) References Cited

U.S. PATENT DOCUMENTS

| | | | |
|---|---|---|---|
| 5,103,557 A | | 4/1992 | Leedy |
| 5,498,886 A | | 3/1996 | Hsu et al. |
| 6,128,240 A | * | 10/2000 | Cutter et al. ............. 365/225.7 |
| 6,430,103 B2 | * | 8/2002 | Nakayama et al. .... 365/230.03 |
| 2002/0097612 A1 | | 7/2002 | Yamane |
| 2002/0112075 A1 | * | 8/2002 | Takashimizu et al. ...... 709/244 |

FOREIGN PATENT DOCUMENTS

| | | |
|---|---|---|
| JP | 61-020348 | 1/1986 |
| JP | 61-144800 | 7/1986 |
| JP | 63-293943 | 11/1988 |
| JP | 03-157899 | 7/1991 |
| JP | 06-295958 | 10/1994 |
| JP | 08-138399 | 5/1996 |
| JP | 2000-003600 | 1/2000 |
| JP | 2000-057800 | 2/2000 |
| JP | 2002-076120 | 3/2002 |

* cited by examiner

*Primary Examiner*—David Lam
(74) *Attorney, Agent, or Firm*—McDermott Will & Emery LLP

(57) ABSTRACT

A semiconductor integrated circuit with integrated memory and data-processing logic portions is provided, with which productivity and yield can be improved. The semiconductor integrated circuit is provided with a memory, a plurality of logic portions that are capable of being connected to the memory, and a separation portion that connects one of the plurality of logic portions to the memory, while separating the other logic portions from the memory. One required logic portion of the plurality of logic portions is connected to the memory, and the other non-required logic portions are separated from the memory, by the separation portion. The semiconductor integrated circuit can be switched for a system LSI after wafer processing, so this enables a plurality of system LSIs to be manufactured using the same exposure masks, thus improving productivity. Furthermore, defective logic portions can be recovered, thus improving the yield.

26 Claims, 11 Drawing Sheets

SEMICONDUCTOR INTEGRATED CIRCUIT

BACKGROUND OF THE INVENTION

The present invention relates to semiconductor integrated circuits, particularly the technology of semiconductor integrated circuits in which a memory and a data-processing logic portion are integrated.

In recent years, DRAMs (dynamic random access memories) are increasingly made as macrocells, and there has been intensive integration of these with data-processing logic portions such as microprocessors and ASICs (application specific ICs), formed on a single semiconductor integrated circuit substrate. Semiconductor integrated circuits in which memory and logic portions are integrated in this way are called system LSIs.

System LSIs are known for the following two advantages. First, there are the points that they eliminate restrictions originating in a DRAM's number of pins, they can expand the data width for data input/output, and they can dramatically improve the speed of data transfer between a DRAM and a logic portion. Second, there are the points that the connection between the DRAM and the logic portion can be achieved by a short distance of metal wiring, the parasitic capacitance of the input/output wiring can be reduced remarkably, and the power consumption of the semiconductor integrated circuit can be reduced.

Furthermore, a DRAM is prepared in advance with redundant memory cells. This makes it possible to substitute a memory cell that has become defective in wafer processing with a prearranged redundant memory cell in a process of redundancy-based memory recovery. This ensures the yield in DRAM manufacture.

System LSIs are often manufactured for specific applications. Separate exposure masks are required in the manufacture of these kinds of semiconductor integrated circuits for specific applications. Moreover, semiconductor integrated circuits for specific applications have to be manufactured through various separate manufacturing processes. However, with continuous shrinking of the manufacturing processes of semiconductor integrated circuits in recent years, producing exposure masks has become very expensive. For this reason, producing separate exposure masks for each system LSI has increased manufacturing costs.

Furthermore, even though the DRAM in a conventional system LSI is prepared with redundant memory cells for substitution, the logic portion is not provided with redundant logic portions. For this reason, a logic portion that becomes defective in wafer processing cannot be recovered, and semiconductor integrated circuits that have such a defective logic portion become defective products. These kinds of reductions in yield also cause the cost of manufacturing semiconductor integrated circuits to increase.

SUMMARY OF THE INVENTION

In consideration of the above-described problems, it is an object of the present invention to make it possible for a semiconductor integrated circuit that includes an integration of a memory such as a DRAM and a logic portion such as a microprocessor or an ASIC, to be switched to the desired system LSI for a specific purpose, after it has undergone steps from development to wafer processing using the same exposure masks, and to improve productivity. Furthermore, it is an object to make it possible to recover a logic portion that has become defective in the wafer processing of a semiconductor integrated circuit, and to improve yield.

To achieve these objects, a semiconductor integrated circuit in accordance with the present invention is provided with a memory, a plurality of logic portions that are connectable to the memory and respectively carry out data processing, and a separation portion that connects at least one of the plurality of logic portions to the memory while separating the other logic portion(s) from the memory.

According to a semiconductor integrated circuit of the present invention, at least one of the plurality of logic portions that are connectable to the memory is connected to the memory, while the other logic portions are separated from the memory, by the separation portion. This enables, after wafer processing has been performed using the same exposure masks containing a plurality of logic portions, a required logic portion to be connected to the memory, and a semiconductor integrated circuit (system LSI) to be achieved as a final product. Consequently, productivity and yields of semiconductor integrated circuits can be improved. Furthermore, by separating non-required logic portions from the memory, the parasitic capacitance of that logic portion's terminals and wiring can be separated from the memory. This enables the electrical capacitance required to drive the semiconductor integrated circuit to be decreased, thus making it possible to reduce power consumption, and increase operation speed. It is anticipated that, in future, memory will continue to occupy an even greater proportion of the area on a system LSI. Conversely, the proportion occupied by logic will continue to decease. Therefore, with a configuration in which a plurality of logic portions are provided, and one of the logic portions is connected to the memory while the others are separated from the memory, no problem is presented in terms of the overall area even when spare logic portions are provided.

It is preferable that the plurality of logic portions of the semiconductor integrated circuit have different functions, and that the separation portion connects a logic portion of the plurality of logic portions that has a function required by that semiconductor integrated circuit to the memory.

In this way, of the plurality of logic portions that have different functions, a logic portion that has a required function is connected to the memory. Consequently, after manufacturing a semiconductor integrated circuit with a single set of exposure masks, it is possible to switch it to a desired system LSI, thus improving the productivity of semiconductor integrated circuits.

It is also preferable that the plurality of logic portions of the semiconductor integrated circuit have the same functions, and that, of the plurality of logic portions, the separation portion connects to the memory a logic portion that has integrity.

In this way, of the plurality of logic portions that have the same function, a logic portion that has integrity, that is, a logic portion that operates normally, is connected to the memory. Consequently, it is possible to recover a logic portion that becomes defective in wafer processing by substituting it with another logic portion that has integrity, thus improving the yield of semiconductor integrated circuits.

It is preferable that the separation portion of the semiconductor integrated circuit has a plurality of fuse circuits arranged between the memory and the respective plurality of logic portions, and a fuse of the fuse circuits that corresponds to the other logic portion(s) is severed. And it is even more preferable that the severance of the fuse of the fuse circuits is accomplished in a process of redundancy-based recovery of memory in a manufacturing process of the semiconductor integrated circuit.

Alternatively, it is also preferable that the separation portion of the semiconductor integrated circuit has a plurality of antifuse circuits arranged between the memory and the respective plurality of logic portions, and an antifuse of the antifuse circuits that corresponds to one of the logic portions is in a conductive state, while another antifuse of the antifuse circuits that corresponds to the other logic portion(s) is in a non-conductive state.

In these ways, non-required logic portions are physically separated from the memory. Consequently, the parasitic capacitance of the terminals, wiring, and the like of the non-required logic portions can be physically separated from the memory, and the electrical capacitance required to drive the semiconductor integrated circuit is decreased, thus making it possible to reduce power consumption, and increase operation speed.

On the other hand, it is preferable that the separation portion of the semiconductor integrated circuit has switching circuits arranged between the memory and the plurality of logic portions, and each of the switching circuits, in regard to each logic portion, perform switching control in response to a received control signal, switching between a connected state, in which the corresponding logic portion and the memory are connected, and a separated state, in which the corresponding logic portion and the memory are separated.

In this way, in response to the control signals given to the switching circuits, control can be preformed for the logic portions, switching between a connected state with the memory and a separated state. Consequently, control of connecting/separating the logic portions and the memory can be achieved by the control signal given to the switching circuits.

It is even more preferable that the switching circuits are arranged between the memory and the respective plurality of logic portions, and have a plurality of transistor switches that, in response to the control signals, perform respective open/close operations, and each of the transistor switches realizes the connected state by closing, while realizing the separated state by opening.

Furthermore, it is even more preferable that the semiconductor integrated circuit is provided with a control signal fixing circuit that fixes the control signal into either the connected state or the separated state.

Furthermore, it is even more preferable that at least one of the plurality of logic portions is provided with a control circuit that judges whether or not the at least one logic portion is accessing the memory, and, based on the result of this judgment, outputs the control signal such that the at least one logic portion goes into either the connected state or the separated state. Moreover, it is preferable that the control circuit outputs the control signal when the at least one logic portion is not required by the semiconductor integrated circuit, outputs the control signal in order that the at least one logic portion goes into the separated state.

In this way, a control signal is output from the control circuit based on a judgment of whether or not the logic portion is accessing the memory. Consequently, it becomes possible for a logic portion to dynamically control connection with, and separation from, itself with the memory. Moreover, it can perform control in order to separate itself from the memory.

It is also preferable that at least one of the plurality of logic portions has a control circuit that, when judging that a logic portion other than the at least one logic portion is an inoperative state, outputs the control signal such that the logic portion other than the at least one logic portion goes into the separated state.

In this way, a control circuit of a logic portion can output a control signal instructing that a logic portion in an inoperative state be separated from the memory when it makes a judgment that this other logic portion is in an inoperative state. Consequently, a failed logic portion that does not operate or similar, can be separated from the memory by a control signal from a logic portion other than its own.

Furthermore, it is also preferable that the memory is provided with a request signal generating circuit that outputs a request signal to at least one of the plurality of logic portions, and said at least one logic portion is provided with a control circuit that judges an operative state of the at least one logic portion when the request signal is received, and, based on the result of this judgment, outputs the control signal such that the at least one logic portion goes into either the connected state or the separated state.

In this way, when a request signal is output from the request signal generating circuit of the memory, the operation status of the logic portion to which the control circuit belongs is judged, and a control signal is output based on the result of this judgment by the control circuit. Consequently, by a request from the memory, a logic portion that is operating normally can be connected to the memory, while a logic portion that is not operating normally can be separated from the memory.

It is also preferable that the semiconductor integrated circuit is provided with a test circuit that determines the integrity of each logic portion and outputs a determination signal based on the result of this determination to each logic portion, and that at least one of the plurality of logic portions is provided with a control circuit that receives the determination signal, and, when the determination signal indicates that the at least one logic portion lacks integrity, outputs the control signal such that the at least one logic portion goes into the separated state.

Alternatively, it is also preferable that the semiconductor integrated circuit is provided with a test circuit that determines the integrity of each logic portion and outputs the control signal such that a logic portion determined to be lacking integrity goes into the separated state.

In these ways, the integrity of each logic portion can be determined by the test circuit, and a control signal can be output instructing that a logic portion determined to lack integrity be separated from the memory. Consequently, it is possible to operate the test circuit each time when the semiconductor integrated circuit is powered on, for example, and test each logic portion, and separate from the memory a logic portion for which the test result is "lacking integrity," for example, when it is determined to be malfunctioning.

On the other hand, it is preferable that the semiconductor integrated circuit is provided with a power source separation circuit that separates the logic portion that is in a separated state from the power source supplied to that logic portion.

Alternatively, it is also preferable that the semiconductor integrated circuit is provided with a substrate voltage changing circuit that, in order to lessen the difference between a power source voltage supplied to a logic portion in the separated state and the substrate voltage of the corresponding logic portion, changes the corresponding substrate voltage.

In this way, a logic portion that is separated from the memory is separated from the power source by the power source separation circuit. Alternatively, the substrate voltage is changed by a substrate voltage changing circuit in order to lessen the difference between a power source voltage of a logic portion separated from the memory and the substrate voltage. Consequently, the off-leak current of the MOS transistors that constitute a logic portion separated from the memory can be controlled, and it is possible to further reduce power consumption.

On the other hand, it is also preferable that the separation portion of the semiconductor integrated circuit selectively connects, of the plurality of logic portions, a used logic portion, which is used by the semiconductor integrated circuit, to the memory, while separating from the memory an unused logic portion, which is a logic portion other than the used logic portion.

In this way, the semiconductor integrated circuit operates while switching the used logic portion, and the unused logic portion is separated from the memory by the separation portion, so that the parasitic capacitance of the wiring and terminals, etc, of the unused logic portion can be separated from the memory. Consequently, the power consumption of the semiconductor integrated circuit is reduced, and circuit operation becomes high-speed and stable.

It is even more preferable that the logic portions can be selectively connected to an output circuit inside the memory, and that the separation portion is arranged between the output circuit and the logic portions, connecting the used logic portion to the output circuit, while separating the unused logic portion from the output circuit.

Alternatively, it is even more preferable that the memory has a plurality of output circuits respectively corresponding to the plurality of logic portions, and the logic portions can be selectively connected to an amp circuit inside the memory via the respective corresponding ones of the output circuits, and the separation portion is arranged between the amp circuit and the output circuits, connecting the used logic portion to the amp circuit, while separating the unused logic portion from the amp circuit.

Alternatively, it is even more preferable that the memory has a plurality of output circuits and a plurality of amp circuits respectively corresponding to the plurality of logic portions, and the logic portions can be selectively connected to a preamp circuit inside the memory via the respective corresponding ones of the output circuits and amp circuits, and the separation portion is arranged between the preamp circuit and the amp circuits, connecting the used logic portion to the preamp circuit, while separating the unused logic portion from the preamp circuit.

Alternatively, it is even more preferable that the memory has a plurality of output circuits, a plurality of amp circuits, and a plurality of preamp circuits respectively corresponding to the plurality of logic portions, and the logic portions can be selectively connected to a sense amp circuit inside the memory via the respective corresponding ones of the output circuits, amp circuits, and preamp circuits, and the separation portion is arranged between the sense amp circuit and the preamp circuits, connecting the used logic portion to the sense amp circuit, while separating the unused logic portion from the sense amp circuit.

In these ways, by making the position in which the separation portion is provided closer to the memory cells inside the memory, the data read times between the memory cells and the separation portion can be shortened. Consequently, the used logic portion can be switched speedily when reading data from the memory, and high-speed memory access operations can be achieved effectively.

Furthermore, it is preferable that the logic portions can be selectively connected to an input circuit inside the memory, and the separation portion is arranged between the input circuit and the logic portions, connecting the used logic portion to the input circuit, while separating the unused logic portion from the input circuit.

Alternatively, it is also even more preferable that the memory has a plurality of input circuits respectively corresponding to the plurality of logic portions, and the logic portions can be selectively connected to a write amp circuit inside the memory via the respective corresponding ones of the input circuits, and the separation portion is arranged between the write amp circuit and the input circuits, connecting the used logic portion to the write amp circuit, while separating the unused logic portion from the write amp circuit.

Alternatively, it is also even more preferable that the memory has a plurality of input circuits and a plurality of write amp circuits respectively corresponding to the plurality of logic portions, and the logic portions can be selectively connected to a write buffer circuit inside the memory via the respective corresponding ones of the input circuits and write amp circuits, and the separation portion is arranged between the write buffer circuit and the write amp circuits, connecting the used logic portion to the write buffer circuit, while separating the unused logic portion from the write buffer circuit.

Alternatively, it is also even more preferable that the memory has a plurality of input circuits, a plurality of write amp circuits, and a plurality of write buffer circuits respectively corresponding to the plurality of logic portions, and the logic portions can be selectively connected to a sense amp circuit inside the memory via the respective corresponding ones of the input circuits, write amp circuits, and write buffer circuits, and the separation portion is arranged between the sense amp circuit and the write buffer circuits, connecting the used logic portion to the sense amp circuit, while separating the unused logic portion from the sense amp circuit.

In these ways, by making the position in which the separation portion is provided closer to the memory cells inside the memory, the data write times between the separation portion and the memory cells can be shortened. Consequently, the used logic portion can be switched speedily when writing data to the memory, and high-speed memory access operations can be achieved effectively.

DETAILED DESCRIPTION OF THE INVENTION

Hereinafter, preferred embodiments of the present invention will be described in detail with reference to the accompanying drawings.

First Embodiment

Figure 1:
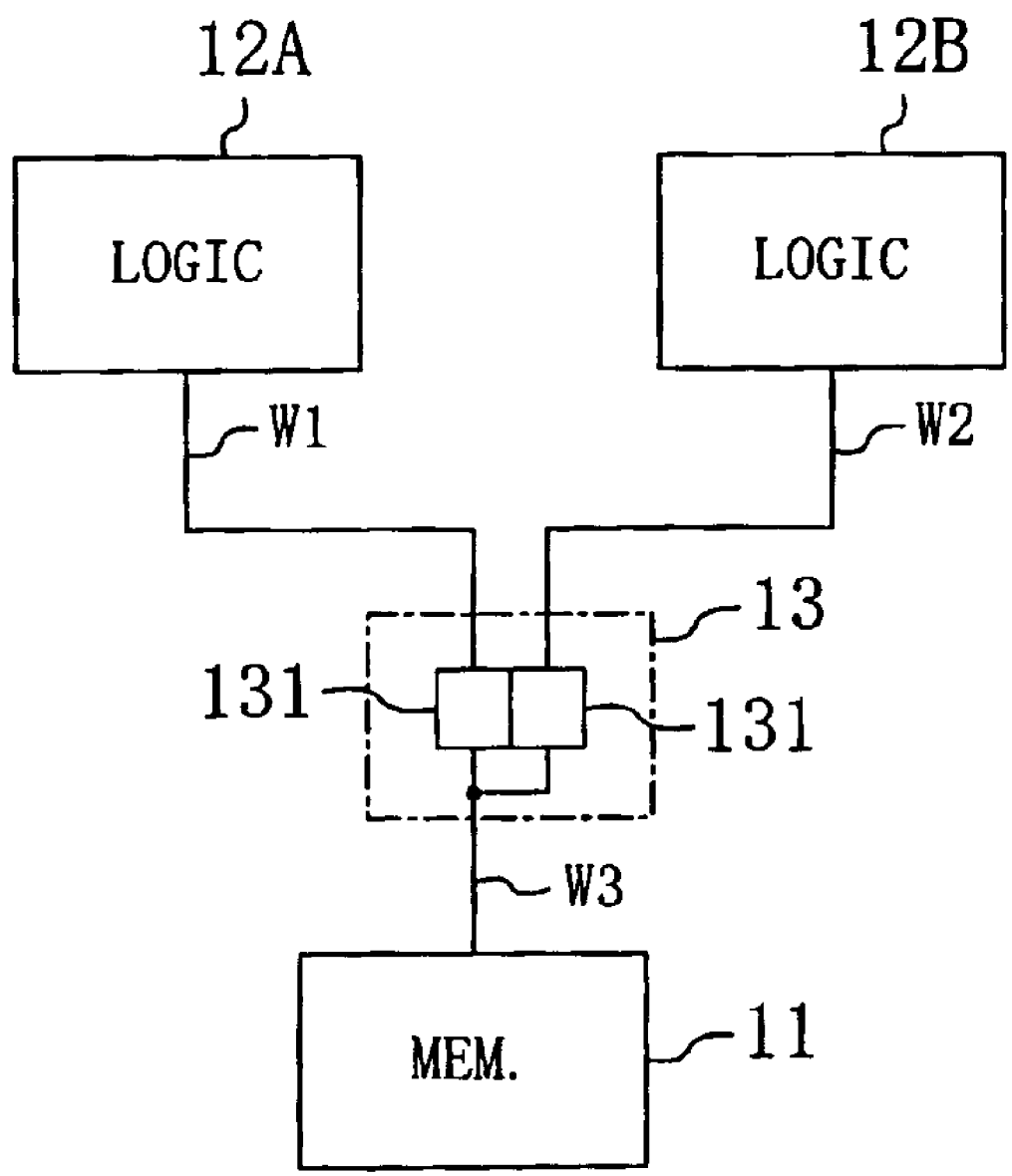
FIG. 1 is a block diagram of a semiconductor integrated circuit according to a first embodiment of the present invention.

FIG. 1 shows a configuration of a semiconductor integrated circuit according to a first embodiment of the present invention. In this embodiment, the semiconductor integrated circuit includes: a memory 11, such as a DRAM (dynamic random access memory), an SRAM (static random access memory), a flash memory, a ROM (read only memory), or a ferroelectric memory; logic portions 12A and 12B that perform data processing, such as microprocessors, ASICs (application specific ICs) or the like; and a separation portion 13, integrated on a single substrate.

Although not shown in the drawing, the memory 11 and the logic portions 12A and 12B are respectively equipped with an address terminal, a data input terminal, a data output terminal, a data input/output terminal, and a clock terminal, for example. These terminals of the logic portions 12A and 12B are respectively connected to the separation portion 13 by wires W1 and W2, and each terminal of the memory 11 is also respectively connected to the separation portion 13 by a wire W3. In this way, the logic portions 12A and 12B can be connected to the memory 11 via the separation portion 13.

Arranged between the memory 11 and the logic portions 12A and 12B respectively, the separation portion 13 is provided with a plurality of (in this embodiment, two) fuse circuits 131 or antifuse circuits 131. The fuses of the fuse circuits 131, or the antifuses of the antifuse circuits 131, are respectively allocated for every wire connecting each terminal of the logic portions 12A and 12B with each corresponding terminal of the memory 11. It should be noted that these fuses or antifuses may be, for example, those that are used in providing redundancy-based recovery for DRAMs.

In this embodiment of the semiconductor integrated circuit, the steps from development to wafer processing are carried out with the same exposure masks provided with both logic portions 12A and 12B. If the circuits 131 are fuses, after the semiconductor integrated circuit has undergone wafer processing, the fuses are in a state of connection, so both logic portions 12A and 12B are connected to the memory 11. However, if operated in this condition, output from the logic portions 12A and 12B will conflict through the separation portion 13, thus becoming a cause of malfunction. Moreover, the output of the memory 11 would have to drive the parasitic capacitance of both wires W1 and W2, and power consumption would be increased more than necessary.

Therefore, with the separation portion 13, either of the logic portions 12A and 12B is connected as a necessary portion to the memory 11, and the other unnecessary portion is separated from the memory 11. For example, if the logic portion 12A is to be connected to the memory 11, and the logic portion 12B is to be separated from the memory 11, all fuses of the separation portion 13 for the logic portion 12B are severed using laser trimming or the like, separating the logic portion 12B from the memory 11. In this way, the semiconductor integrated circuit assume a state which only the logic portion 12A is connected to the memory 11.

On the other hand, if the circuits 131 are antifuse circuits, after the semiconductor integrated circuit has undergone wafer processing, the antifuses are in a non-conductive state, so both logic portions 12A and 12B are separated from the memory 11. Accordingly, a voltage is applied to the antifuses of the separation portion 13 for the logic portion 12A to put these antifuses into a conductive state, connecting the logic portion 12A to the memory 11.

It is unnecessary to add a new manufacturing process in order to sever the fuses of the fuse circuits 131, or to make conductive the antifuses of the antifuse circuits 131. This can be done, for example, in the process from redundancy-based memory recovery (a process in which memory cells that have become defective through the manufacturing process are replaced with prearranged redundant memory cells).

The logic portions 12A and 12B may have different functions, or they may have the same functions. If they have different functions, after wafer processing of the semiconductor integrated circuit with the same exposure masks, by connecting the logic portion 12A to the memory 11 for example, it is possible to obtain as a finished product a system LSI that achieves the functions of the logic portion 12A. Conversely, by connecting the logic portion 12B to the memory 11, it is possible to obtain a system LSI that achieves the functions of the logic portion 12B. In other words, by having the logic portions 12A and 12B possess different functions, it is possible to switch the semiconductor integrated circuit after wafer processing to the desired system LSI.

On the other hand, in the case of the logic portions 12A and 12B having the same functions, if the logic portion 12A, for example, is found to be defective during a wafer test, recovery can be achieved by connecting the logic portion 12B to the memory 11. In other words, by having the logic portions 12A and 12B possess the same functions, it is possible to provide redundancy-based recovery of the logic portions.

Furthermore, by separating the unnecessary portion of logic portion 12A and 12B from the memory 11, it is possible to physically separate the parasitic capacitance of the wiring of the unnecessary portion from the memory 11. In this way, the electrical capacitance required to be driven by the semiconductor integrated circuit is decreased, thus making it possible to reduce power consumption, and increase operation speed. Moreover, there is no longer any conflict between the output of the logic portions 12A and 12B, and stable data transfer can be achieved between the memory 11 and the logic portion 12A (or 12B).

Therefore, according to this embodiment, after wafer processing has been performed for a semiconductor integrated circuit with the same exposure masks that contains both the logic portions 12A and 12B, the separation portion 13 connects either one of the logic portions 12A and 12B to the memory 11, while the other logic portion is separated from the memory 11. In this way, it becomes possible to switch a post-wafer-processing semiconductor integrated circuit to various system LSIs, and improve the productivity of semiconductor integrated circuits. Also, redundancy-based recovery of the logic portions becomes possible, improving the yield of the wafer processing. Furthermore, by physically separating the unnecessary logic portion from the memory 11, it becomes possible to reduce the power consumption of the semiconductor integrated circuit, and increase operation speed.

Figure 2:
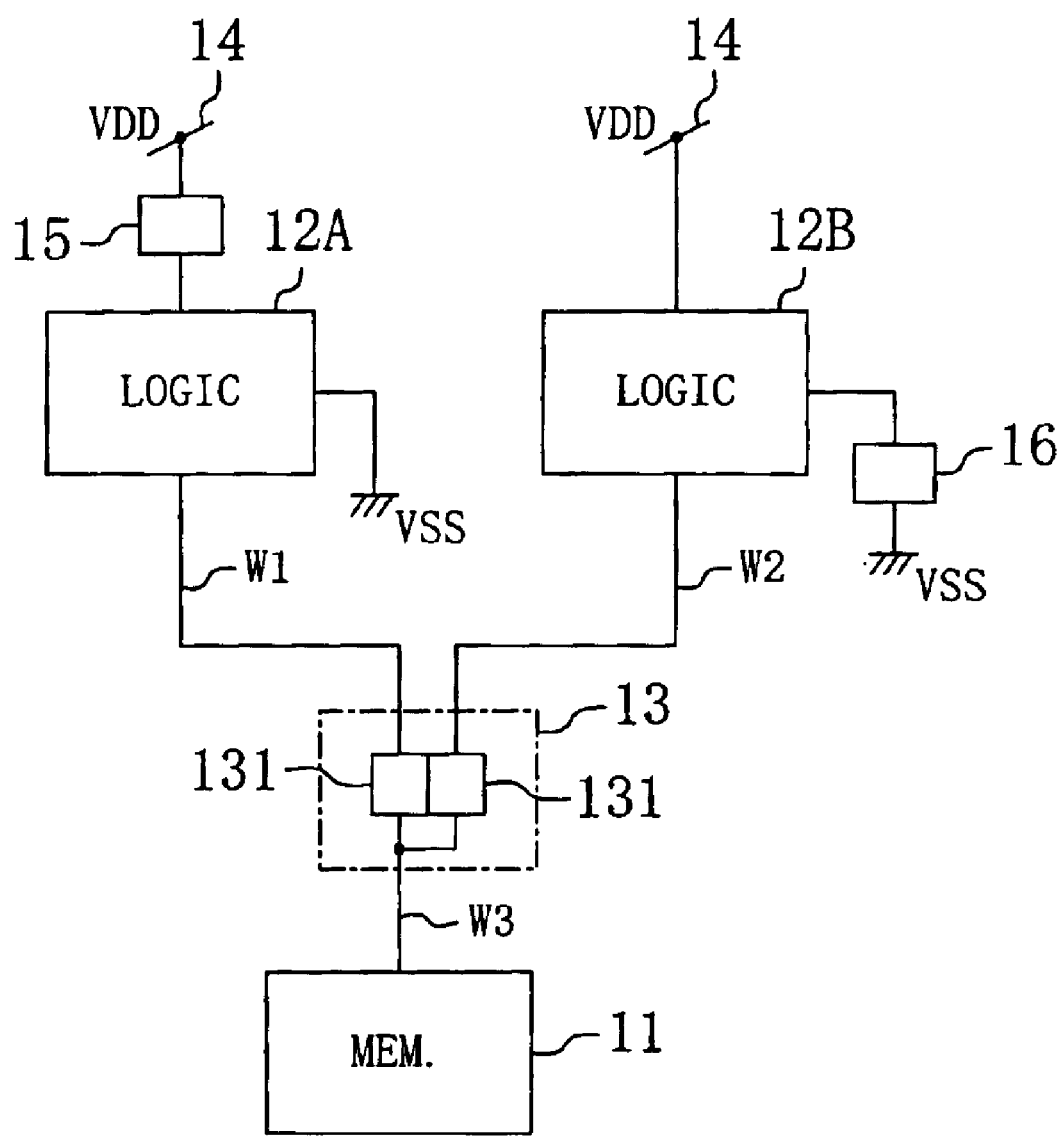
FIG. 2 is a block diagram of a semiconductor integrated circuit according to a second embodiment of the present invention.

It should be noted this embodiment was explained for the case that the semiconductor integrated circuit is provided with one memory 11 and two logic portions 12A and 12B, but the present invention is not limited to these numbers. The same effect according to the present invention can also be achieved for semiconductor integrated circuits provided with two or more memories and three or more logic portions.
Second Embodiment FIG. 2 shows a configuration of a semiconductor integrated circuit according to a second embodiment of the present invention. The semiconductor integrated circuit according to this embodiment is provided with, in addition to the semiconductor integrated circuit according to the first embodiment, a power source separation circuit 15 for separating a power source 14 that is supplied to the logic portion 12A, and a substrate voltage changing circuit 16 for changing a substrate voltage VSS of the logic portion 12B. The following is an explanation of aspects that differ from the first embodiment, particularly the operation of the power source separation cricuit 15 and the substrate voltage changing circuit 16.

The power source separation circuit 15 connects, or separates, the power source 14 and the logic portion 12A. Like the separation portion 13, it can be configured with fuses or antifuses, or switches such as MOS transistors.

The substrate voltage changing circuit 16 changes the substrate voltage VSS of the logic portion 12B in order to minimize the difference between the substrate voltage VSS and the voltage VDD of the power source 14 that is supplied to the logic portion 12B separated from the memory 11. Here, the power source 14 supplied to the logic portion 12B is provided separately from the substrate power source of the MOS transistors that constitute the logic portion 12B. Like the separation portion 13, the substrate voltage changing circuit 16 can be configured with fuses or antifuses, or switches such as MOS transistors.

Even when the logic portion 12A is separated as an unnecessary portion from the memory 11 by the separation portion 13, if the voltage VDD of the power source 14 is being supplied to the logic portion 12A, there will be a flow of off-leak current or similar to the MOS transistors that constitute the logic portion 12A. For this reason, even though the logic portion 12A may be separated from the memory 11, there is a wasteful consumption of electrical power. Therefore, the power source separation circuit 15 separates the power source 14 that is supplied to the logic portion 12A separated from the memory 11, and ensuring that there is no wasteful consumption of electrical power by the logic portion 12A.

On the other hand, by changing the substrate voltage VSS in order to lessen the difference between the substrate voltage VSS and the voltage VDD of the power source 14 that is supplied to the logic portion 12B, the substrate voltage changing circuit 16 suppresses the flow of off-leak current or similar to the MOS transistors that constitute the logic portion 12B, ensuring that there is no wasteful consumption of electrical power by the logic portion 12B.

In this way, according to this embodiment, off-leak current that occurs in the logic portion 12A or logic portion 12B that is separated from the memory 11 is suppressed by the power source separation circuit 15, or the substrate voltage changing circuit 16, allowing a further reduction in power consumption.

Figure 3:
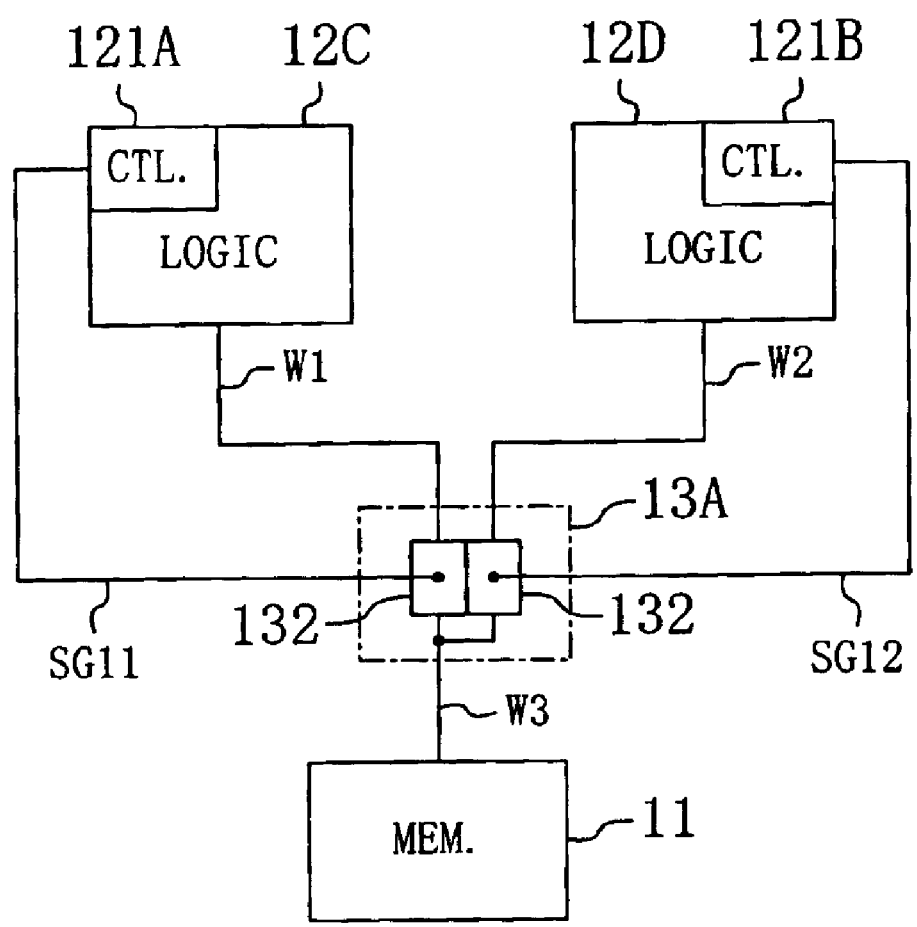
FIG. 3 is a block diagram of a semiconductor integrated circuit according to a third embodiment of the present invention.

It should be noted that, in this embodiment, the power source separation circuit 15 and the substrate voltage changing circuit 16 are both provided, but it is not necessary for these to be provided at the same time. The effect of the present invention can be obtained by providing only the power source separation circuit 15 or the substrate voltage changing circuit 16.
Third Embodiment FIG. 3 shows a configuration of a semiconductor integrated circuit according to a third embodiment of the present invention. In this embodiment, the semiconductor integrated circuit includes: a memory 11, a logic portion 12C that has a control circuit 121A, a logic portion 12D that has a control circuit 121B, and a separation portion 13A that has switching circuits for controlling the switching between connection and separation of the logic portions 12C/12D and the memory 11, integrated on a single substrate.

As switching circuits, the separation portion 13A is provided with a plurality of (in this embodiment, two) transistor switches 132, arranged between the memory 11 and the logic portions 12C and 12D respectively. The transistor switches 132 are respectively allocated for every wire connecting each terminal of the logic portions 12C and 12D with each corresponding terminal of the memory 11.

The open/close operations of the transistor switches 132 are controlled by giving control signals SG11 and SG12 to gate electrodes. For example, when the control signal SG11 is the instruction for connecting the logic portion 12C to the memory 11, the transistor switch 132 closes, and the wire W1 is connected to the wire W3. On the other hand, when the control signal SG11 is the instruction for separating the logic portion 12C from the memory 11, the transistor switch 132 opens and the wire W1 and wire W3 are separated.

It should be noted that, although not shown in the drawing, the control signals SG11 and SG12 can be fixed as an instruction for either connecting or separating the memory 11 and the logic portions 12C/12D by a control signal fixing circuit. The control signal fixing circuit can be configured with fuses or antifuses and the like, with the control signals SG11 and SG12 being fixed by severing the fuse or making the antifuse conductive.

On the other hand, the control circuits 121A and 121B judge whether or not the logic portions 12C and 12D to which they belong are accessing the memory 11, and output control signals SG11 and SG12 based on the result of this judgment. For example, when the logic portion 12C is to perform a data transmission or a control in regard to the memory 11, the control circuit 121A judges that the logic portion 12C is accessing the memory 11 by an internal signal from the logic portion 12C. It then outputs the control signal SG11 to the separation portion 13A instructing that the logic portion 12C is connected to the memory 11. On the other hand, when the logic portion 12C is not performing a data transmission or a control in regard to the memory 11, the control circuit 121A judges that the logic portion 12C is not accessing the memory 11, and outputs the control signal SG11 to the separation portion 13A instructing that the logic portion 12C is to be separated from the memory 11.

Furthermore, converse to the above, in regard to the control circuits 121A and 121B, a control signal may be output from the control circuit of the logic portion that is accessing the memory 11, instructing that the transistor switch 132 for the other logic portion that is not accessing the memory is to be separated. For example, when the control circuit 121A judges that the logic portion 12C to which it belongs is accessing the memory 11, the control signal SG11 is output to the transistor switch 132 of the logic portion 12D, instructing that the logic portion 12D, which is the other logic portion, is to be separated from the memory 11. In this way, the logic portion 12D, which is not accessing the memory 11, can be separated from the memory 11.

Incidentally, there may be times in which the requirement/ non-requirement of the logic portions 12C and 12D is known in advance. For example, a logic portion that does not operate due to failure is not required. It is preferable that non-required logic portions such as this are separated from the memory 11. Accordingly, it is possible that the control circuits 121A and 121B are set so that they constantly output a control signal SG11 or SG12 instructing that the logic portions 12C and 12D to which they belong are separated from the memory 11. Specifically, by equipping the control circuits 121A and 121B with flash memories or fuses or the like, and setting the flash memory, or severing the fuse, control signals SG11 and SG12 can be constantly output, instructing that one of the logic portions 12C and 12D is separated from the memory 11.

In this way, according to this embodiment, the transistor switches 132 of the separation portion 13A are controlled by the output of the control signals SG11 and SG12 from the control circuits 121A and 121B, and the logic portion that is accessing the memory 11 can be connected to the memory 11, while the other logic portion, which is not accessing the memory, is separated from the memory 11. This enables the parasitic capacitance of the terminals and wiring of the logic portion that is not accessing the memory 11 to be separated from the memory 11, and the power required to drive the memory 11 can be reduced. Accordingly, it becomes possible to reduce the power consumption of the semiconductor integrated circuit, and also possible to attain increased circuit operation speeds.

It should be noted that here the control signals SG11 and SG12 are output from the control circuits 121A and 121B, but the present invention is not limited to this. Having the control signals SG11 and SG12 output from circuits other than the control circuits 121A and 121B can achieve the same effect according to the present invention. Moreover, it is not necessary that all logic portions have a control circuit, and it is sufficient if at least one logic portion has a control circuit.

Furthermore, instead of a plurality of transistor switches 132 as the switching circuits in the separation portion 13A, it is also possible to provide a single selector circuit, for example. The selector circuit makes it possible to connect either the logic portion 12C or the logic portion 12D to the memory 11, and to separate the other logic portion from the memory 11, thus achieving the same effect as above.

Fourth Embodiment

Figure 4:
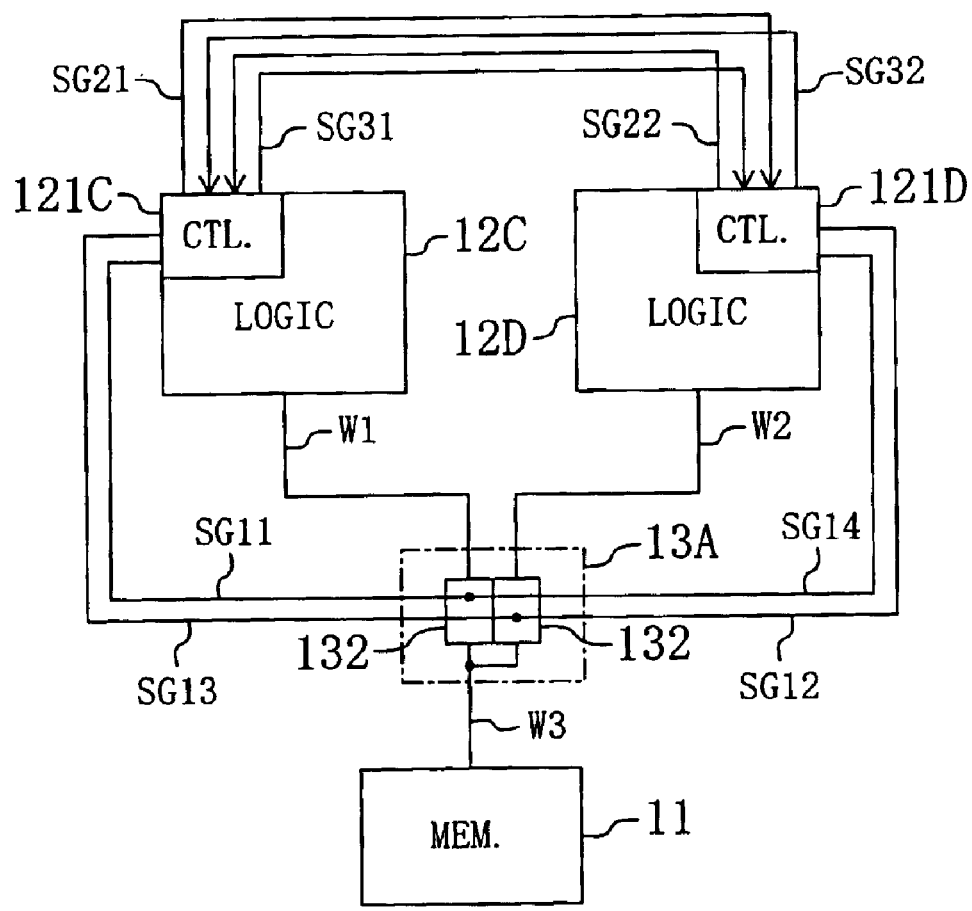
FIG. 4 is a block diagram of a semiconductor integrated circuit according to a fourth embodiment of the present invention.

FIG. 4 shows a configuration of a semiconductor integrated circuit according to a fourth embodiment of the present invention. In place of the control circuits 121A and 121B of the semiconductor integrated circuit according to the third embodiment, the semiconductor integrated circuit according to this embodiment has control circuits 121C and 121D that are capable of inputting/outputting verify signals SG21 and SG22, and reply signals SG31 and SG32. The following is an explanation of aspects that differ from the third embodiment, particularly the operation of the control circuits 121C and 121D.

The control circuit 121C outputs the verify signal SG21 to the logic portion 12D, which is a logic portion other than the logic portion 12C of the control circuit 121C. Then, by receiving the reply signal SG32 from the logic portion 12D, it judges that the logic portion 12D is operating. On the other hand, when it does not receive the reply signal SG32 from the logic portion 12D, the control circuit 121C judges that the logic portion 12D is in an inoperative state, and outputs the control signal SG13 instructing that the logic portion 12D be separated from the memory 11. Furthermore, the control circuit 121C, upon receiving the verify signal SG22, outputs the reply signal SG31.

The control circuit 121D operates in the same way as the control circuit 121C. So, with these control circuits 121C and 121D verifying the operational state of the other's logic portion, the connection/separation of the logic portions 12C/12D with the memory 11 is controlled.

In this way, according to this embodiment, when the other logic portion, 12D (or 12C), is judged as being in an inoperative state by the control circuit 121C (or 121D), the control signal SG13 (or SG14) is output, instructing that the logic portion 12D (or 12C) be separated from the memory 11. This enables a logic portion that cannot output a control signal because it does not operate due to failure or the like, or because it cannot itself output a control signal in order for it be separated from the memory 11, to be separated from the memory 11 by control enabled by the control circuit of another other logic portion.

Fifth Embodiment

Figure 5:
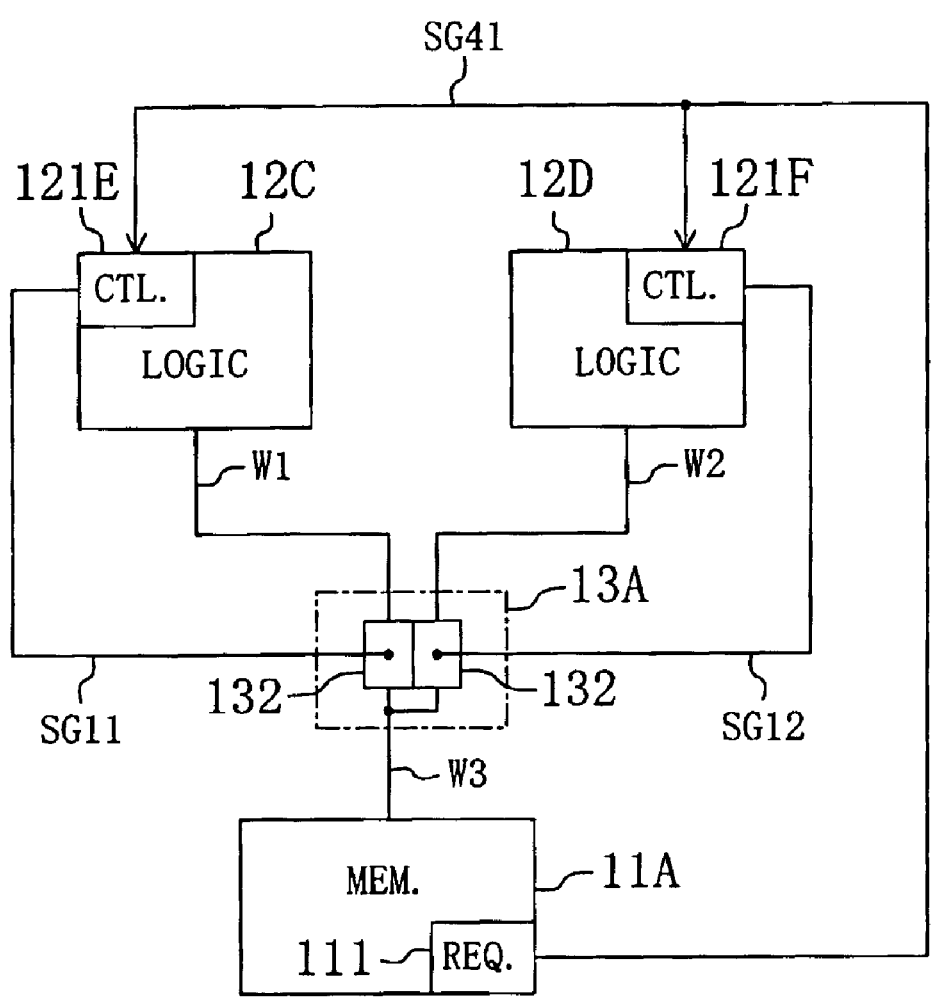
FIG. 5 is a block diagram of a semiconductor integrated circuit according to a fifth embodiment of the present invention.

FIG. 5 shows a configuration of a semiconductor integrated circuit according to a fifth embodiment of the present invention. The semiconductor integrated circuit according to this embodiment is provided with a memory 11A that has a request signal generating circuit 111, which outputs a request signal SG41. The following is an explanation of aspects that differ from the third embodiment, particularly the operation of the request signal generating circuit 111.

For each of the logic portions 12C and 12D, the request signal generating circuit 111 outputs the request signal SG41 requesting connection to or separation from the memory 11A.

By receiving the request signal SG41 requesting connection to the memory 11A, the control circuits 121E and 121F of the logic portions 12C and 12D judge the operation status of the logic portions 12C and 12D to which they belong. Then, when the status is judged as operating normally, the control circuits output the control signals SG11 and SG12, instructing that the logic portions 12C and 12D to which they belong are to be connected to the memory 11A. On the other hand, when the status is judged as not operating normally, the control circuits output the control signals SG11 and SG12, instructing that the logic portions 12C and 12D to which they belong are to be separated from the memory 11A.

On the other hand, by receiving the request signal SG41 requesting separation from the memory 11A, the control circuits 121E and 121F output the control signals SG11 and SG12, instructing that the logic portions 12C and 12D to which they belong are to be separated from the memory 11A.

In this way, according to this embodiment, in response to the request signal SG41 that is output from the request signal generating circuit 111 of the memory 11A, the connection/separation of the logic portions 12C/12D and the memory 11A can be controlled. This enables a logic portion that is not operating normally to be separated from the memory 11A.

It should be noted that it is not necessary for all logic portions to have a control circuit. It is possible to achieve the same effect according to the present invention by providing at least one logic portion with a control circuit.

Furthermore, by giving the request signal SG41 from the request signal generating circuit 111, instead of the verify signals SG21 and SG22 according to the fourth embodiment, a logic portion that cannot output a control signal because it does not operate due to failure or the like, or because it cannot itself output a control signal in order for it be separated from the memory 11A, can be separated from the memory 11A by control enabled by the control circuit of another other logic portion.

Sixth Embodiment

Figure 6:
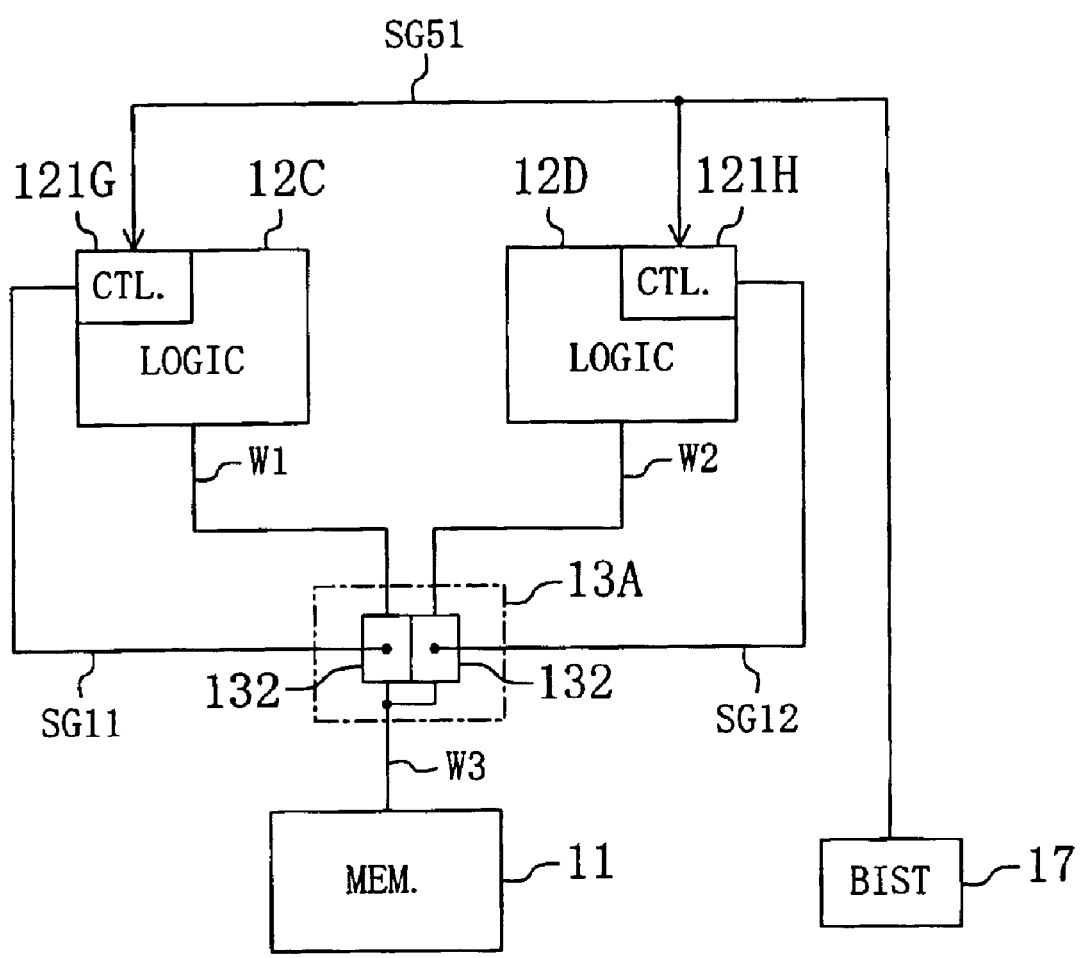
FIG. 6 is a block diagram of a semiconductor integrated circuit according to a sixth embodiment of the present invention.

FIG. 6 shows a configuration of a semiconductor integrated circuit according to a sixth embodiment of the present invention. The semiconductor integrated circuit according to this embodiment is provided with, in addition to the semiconductor integrated circuit according to the third embodiment, a BIST (built-in self-test) circuit 17. The following is an explanation of aspects that differ from the third embodiment, particularly the operation of the BIST circuit 17.

When the semiconductor integrated circuit is powered on, the BIST circuit 17 automatically tests the integrity of the logic portions 12C and 12D, and determines whether each is operating normally or operating incorrectly and thus defective. Then, based on the result of this determination, it outputs a determination signal SG51 to the logic portions 12C and 12D.

Control circuits 121G and 121H receive the determination signal SG51 and output the control signals SG11 and SG12 in accordance with what is indicated by this determination signal SG51. Specifically, when the determination signal SG51 indicates that the logic portion 12C lacks integrity, the control circuit 121G outputs the control signal SG11 instructing that the logic portion 12C to which it belongs is to be separated from the memory 11.

Figure 7:
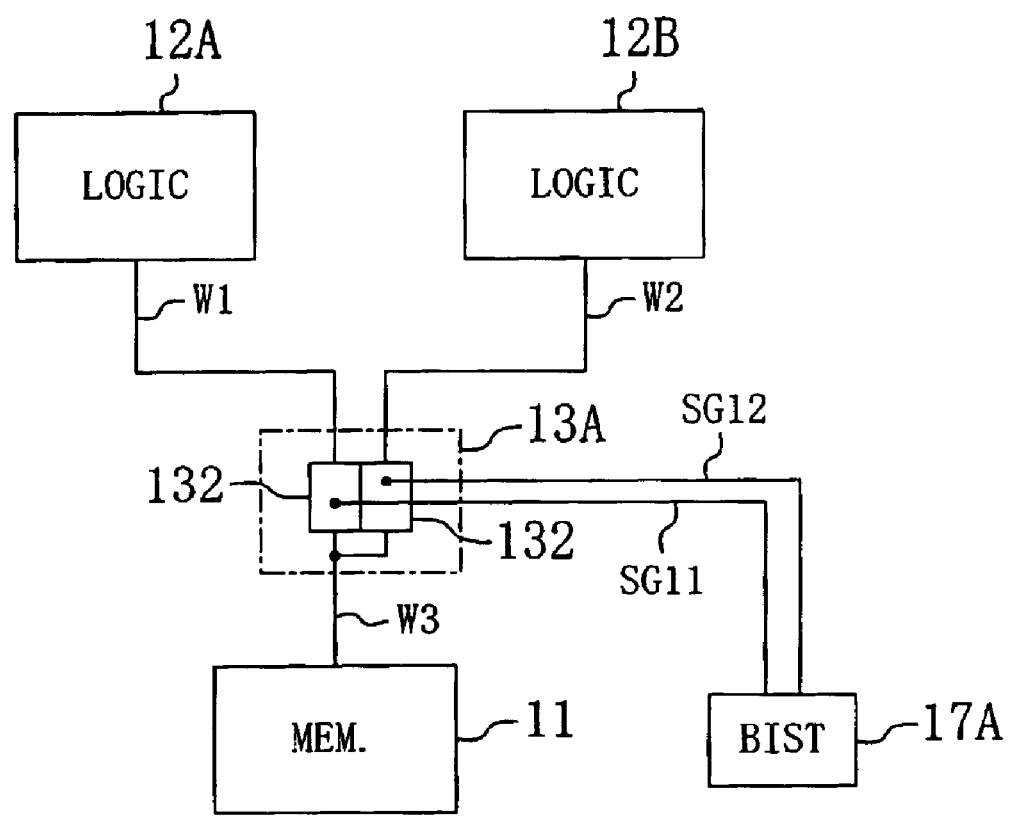
FIG. 7 is a block diagram of a semiconductor integrated circuit according to a sixth embodiment of the present invention.

FIG. 7 shows a different example configuration according to this embodiment. As shown in FIG. 7, the control signals SG11 and SG12 given to the separation portion 13A can also be output from the BIST circuit 17A.

In this way, according to this embodiment, the integrity of the logic portions 12C and 12D is automatically examined by the BIST circuits 17 and 17A when the semiconductor integrated circuit is powered on, and a logic portion that is determined to lack integrity is separated from the memory 11. This makes it unnecessary to provide a process for separating a non-required logic portion in the manufacture of semiconductor integrated circuits, and enables a non-required failed logic portion or the like to be separated dynamically during use of the semiconductor integrated circuit.

It should be noted that it is not necessary for all logic portions to have a control circuit. It is possible to achieve the same effect according to the present invention by providing at least one logic portion with a control circuit.

Seventh Embodiment

Figure 8:
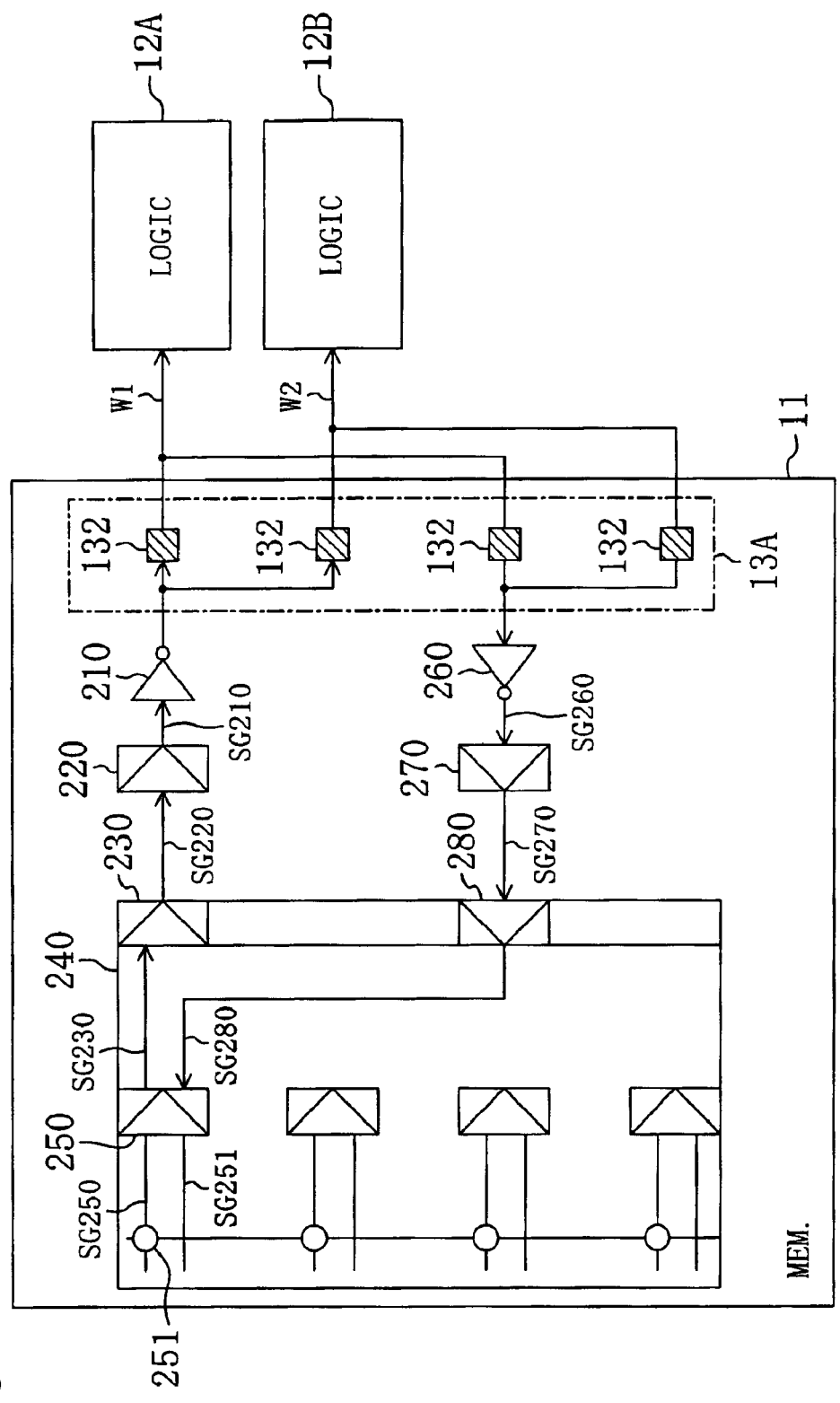
FIG. 8 is a block diagram of a semiconductor integrated circuit according to a seventh embodiment of the present invention.

FIG. 8 shows a configuration of a semiconductor integrated circuit according to a seventh embodiment of the present invention. The semiconductor integrated circuit according to this embodiment may sequentially switch between and alternately drives the logic portions 12A and 12B. Specifically, the logic portion 12A is connected to the memory 11 as the used logic portion that is to be used by the semiconductor integrated circuit, while the logic portion 12B is separated from the memory 11 as the unused logic portion that is not used. Next, the used logic portion is switched, and the logic portion 12B is connected to the memory 11 as the used logic portion, while the logic portion 12A is separated from the memory 11 as the unused logic portion. The logic portions 12A and 12B are alternately driven by repeating this.

The separation portion 13A is configured with the switching circuits explained in the third embodiment. Note that the control signals controlling the separation portion 13A are omitted from the drawing.

The memory 11 is provided with an output circuit 210, an amp circuit 220, a preamp circuit 230, a memory cell array portion 240, an input circuit 260, a write amp circuit 270, and a write buffer circuit 280. The memory cell array portion 240 is provided with a sense amp circuit 250, and a memory cell 251.

The separation portion 13A is arranged between the output circuit 210 and the logic portions 12A/12B, and between the input circuit 260 and the logic portions 12A/12B. And the logic portions 12A and 12B are capable of being selectively connected to the output circuit 210 and the input circuit 260 via the separation portion 13A.

The following is an explanation of the data transfer between the memory 11 and the logic portions 12A/12B. Data written from the logic portions 12A/12B to the memory 11 will be explained first.

Write data is input to the input circuit 260 from the logic portion 12A (or 12B) through a memory-logic connecting wire WI (or W2). The input circuit 260 can be configured with an inverter or the like. Based on the write data, the input circuit 260 outputs a write data signal SG260 to the write amp circuit 270. The write amp circuit 270 has the function of amplifying the input signal. Based on the write data signal SG260, the write amp circuit 270 outputs an internal write signal SG270 to the write buffer circuit 280 adjacent to the memory cell array portion 240. Based on the internal write signal SG270, the write buffer circuit 280 outputs an array data signal SG280 to the sense amp circuit 250. Then, the amplified data is written by the sense amp circuit 250 to the memory cell 251 via a bit line SG250 and a complementary bit line SG251.

On the other hand, the operation of reading out data from the memory 11 to the logic portions 12A and 12B is as follows. First, data is read out from the memory cell 251 to the bit line SG250 and the complementary bit line SG251. The sense amp circuit 250 compares the data of the bit line SG250 and the complementary bit line SG251, amplifies the data, and outputs an array data signal SG230. The preamp circuit 230 adjacent to the memory cell array portion 240 amplifies the array data signal SG230, and outputs it as a preamp signal SG220. The amp circuit 220 amplifies the preamp signal SG220, and outputs an amp signal SG210. Then, the output circuit 210 outputs the amp signal SG210 as output data from the memory 11, outputting it through the memory-logic connecting wire WI (or W2) to the logic portion 12A (or 12B).

According to this embodiment, due to the separation portion 13A, one of the logic portions 12A and 12B is connected to the memory 11 as the used logic portion (for example, logic portion 12A) that is used in the semiconductor integrated circuit, while the unused logic portion (for example, logic portion 12B), which is not used, is separated from the memory 11. In this way, by separating the unused logic portion from the memory 11, the parasitic capacitance of the unused logic portion's terminals and wiring, etc, is separated from the memory 11, and it becomes possible to reduce the power consumption of the semiconductor integrated circuit, and increase operation speed.

Furthermore, by providing the separation portion 13A internal to the memory 11, the distance between the memory cell 251 and the separation portion 13A can be shortened, and the data read/write times between the separation portion 13A and the memory cell 251 can be reduced. Consequently, the switching cycle of the logic portions 12A and 12B can be made shorter, and high-speed read/write memory access operations can be achieved effectively.

It should be noted that a RAM, which is capable of reading and writing data, was presumed for the memory 11 in the explanations above, but the same effect can be achieved according to the present invention even by a ROM, into which data cannot be written.

Eighth Embodiment

Figure 9:
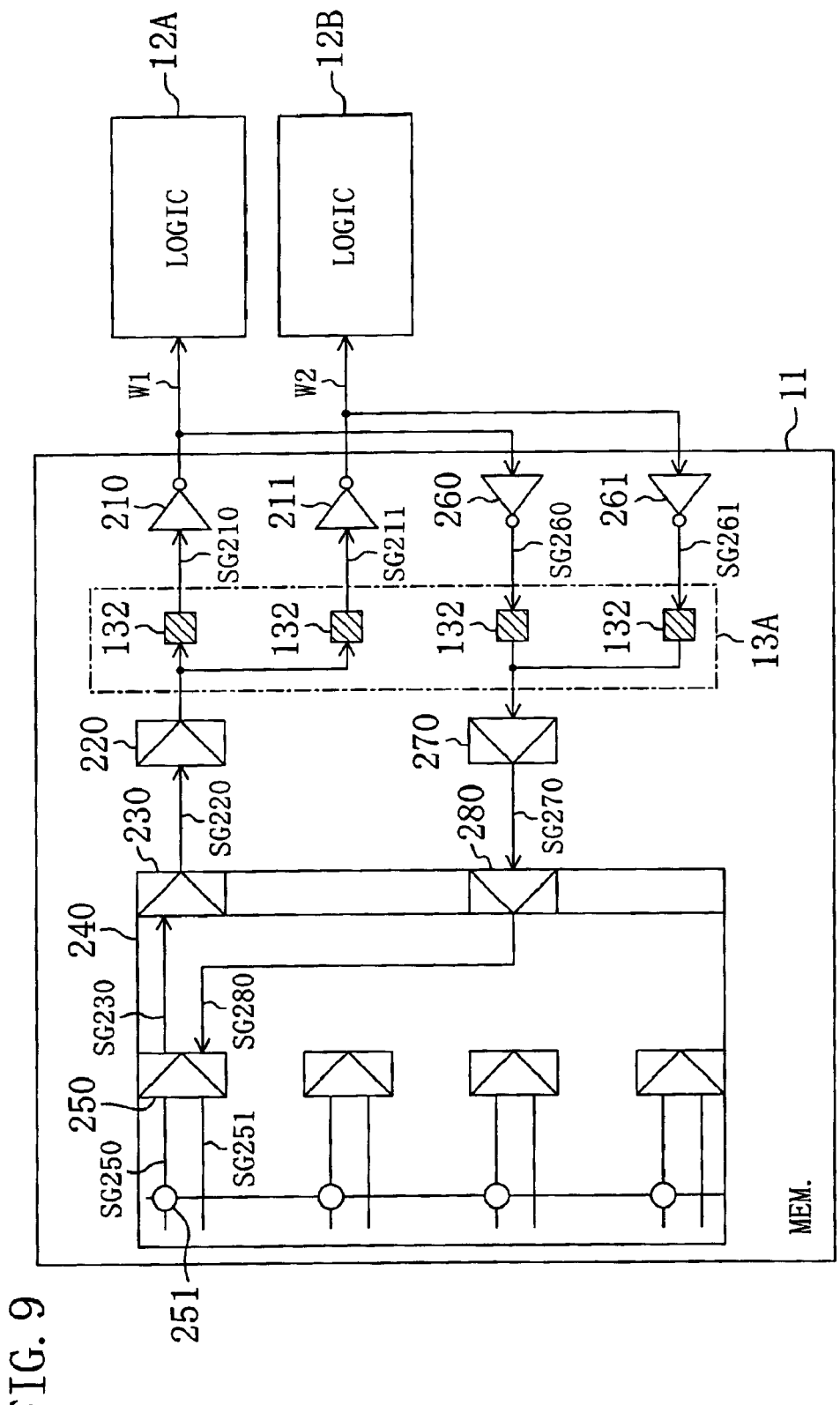
FIG. 9 is a block diagram of a semiconductor integrated circuit according to a eighth embodiment of the present invention.

FIG. 9 shows a configuration of a semiconductor integrated circuit according to an eighth embodiment of the present invention. The semiconductor integrated circuit according to this embodiment is provided with the separation portion 13A in a position that is even closer to the memory cell 251 than in the seventh embodiment.

The memory 11 is provided with the output circuits 210 and 211 and the input circuits 260 and 261 respectively corresponding to the logic portions 12A and 12B. The logic portions 12A and 12B are capable of being selectively connected to the amp circuit 220 via the corresponding output circuits 210 and 211. Moreover, they are capable of being selectively connected to the write amp circuit 270 via the corresponding input circuits 260 and 261.

Data writes from the logic portion 12A (or 12B) to the memory 11 are performed via the input circuit 260 (or 261). On the other hand, data reads from the memory 11 to the logic portion 12A (or 12B) are performed via the output circuit 210 (or 211).

According to this embodiment, as the distance between the memory cell 251 and the separation portion 13A can be made shorter, the data read/write times between the separation portion 13A and the memory cell 251 can be reduced further. Consequently, the switching cycle of the logic portions 12A and 12B can be further shortened, and high-speed read/write memory access operations can be achieved effectively.

Ninth Embodiment

Figure 10:
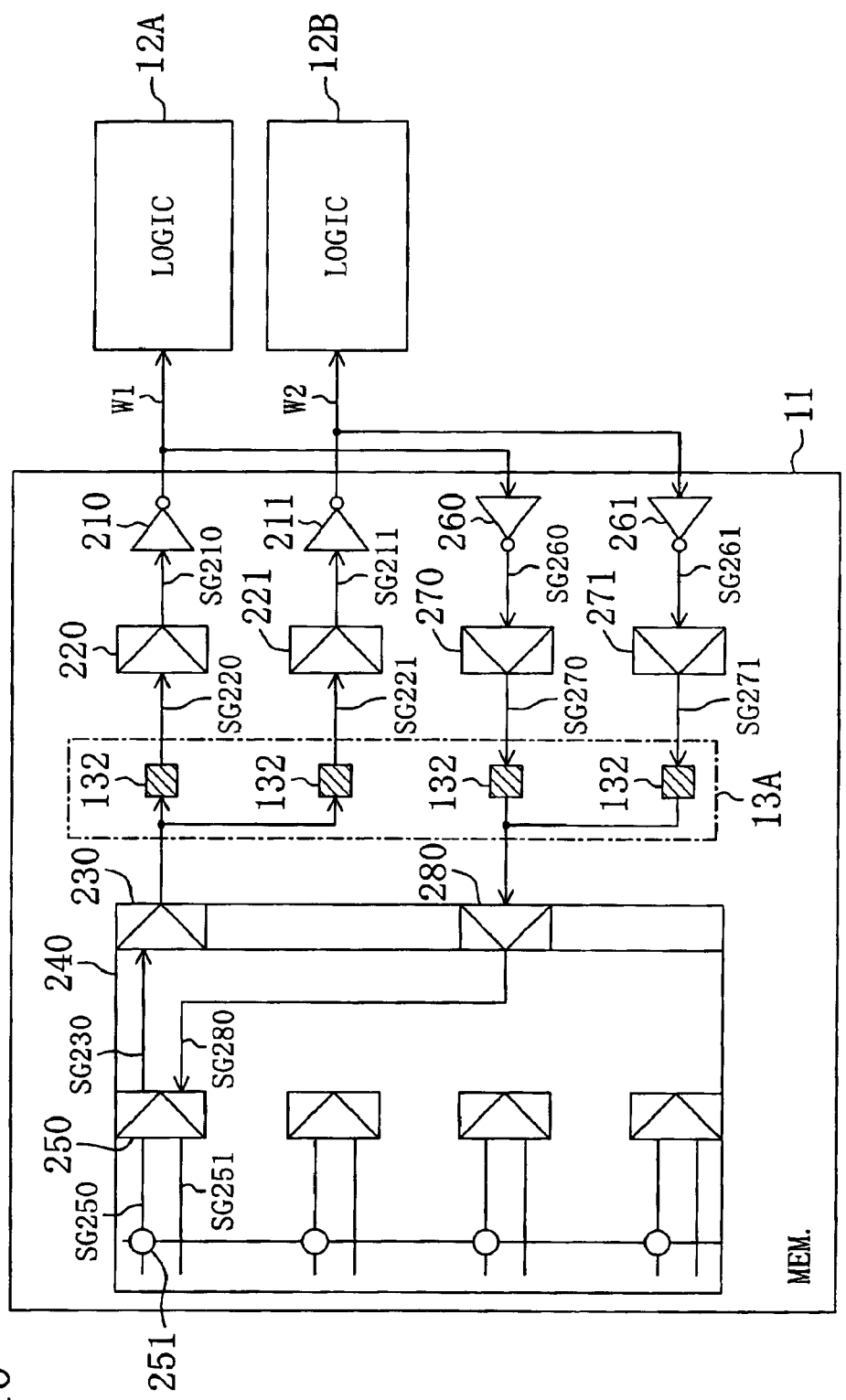
FIG. 10 is a block diagram of a semiconductor integrated circuit according to a ninth embodiment of the present invention.

FIG. 10 shows a configuration of a semiconductor integrated circuit according to a ninth embodiment of the present invention. The semiconductor integrated circuit according to this embodiment is provided with the separation portion 13A in a position that is even closer to the memory cell 251 than in the eighth embodiment.

The memory 11 is provided with the output circuits 210 and 211, the amp circuits 220 and 221, the input circuits 260 and 261, and the write amp circuits 270 and 271 respectively corresponding to the logic portions 12A and 12B. The logic portions 12A and 12B are capable of being selectively connected to the preamp circuit 230 via the corresponding output circuits 210 and 211 and the amp circuits 220 and 221. Moreover, they are capable of being selectively connected to the write buffer circuit 280 via the corresponding input circuits 260 and 261 and the write amp circuits 270 and 271.

Data writes from the logic portion 12A (or 12B) to the memory 11 are performed via the input circuit 260 (or 261) and the write amp circuit 270 (or 271). On the other hand, data reads from the memory 11 to the logic portion 12A (or 12B) are performed via the output circuit 210 (or 211) and the amp circuit 220 (or 221).

According to this embodiment, as the distance between the memory cell 251 and the separation portion 13A can be shortened even further, the data read/write times between the separation portion 13A and the memory cell 251 can be reduced further still. Consequently, the switching cycle of the logic portions 12A and 12B can be further shortened, and even higher-speed read/write memory access operations can be achieved effectively.

Tenth Embodiment

Figure 11:
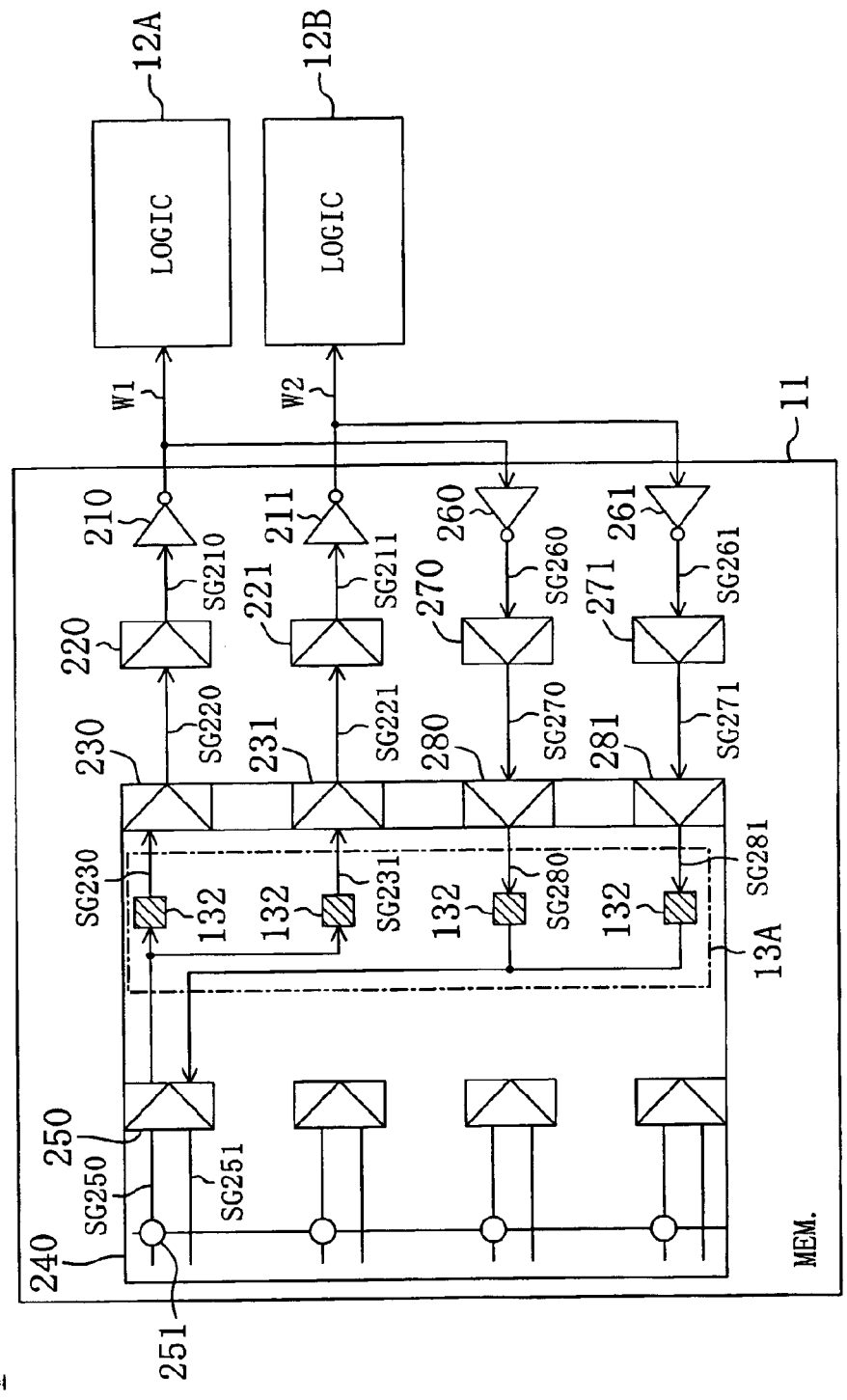
FIG. 11 is a block diagram of a semiconductor integrated circuit according to a tenth embodiment of the present invention.

FIG. 11 shows a configuration of a semiconductor integrated circuit according to a tenth embodiment of the present invention. The semiconductor integrated circuit according to this embodiment is provided with the separation portion 13A in a position that is even closer to the memory cell 251 than in the ninth embodiment.

The memory 11 is provided with the output circuits 210 and 211, the amp circuits 220 and 221, the preamp circuits 230 and 231, the input circuits 260 and 261, the write amp circuits 270 and 271, and the write buffer circuits 280 and 281 respectively corresponding to the logic portions 12A and 12B. The logic portions 12A and 12B are capable of being selectively connected to the sense amp circuit 250 via the corresponding output circuits 210 and 211, the amp circuits 220 and 221, and the preamp circuits 230 and 231. Moreover, they are capable of being selectively connected to the sense amp circuit 250 via the corresponding input circuits 260 and 261, the write amp circuits 270 and 271, and the write buffer circuits 280 and 281.

Data writes from the logic portion 12A (or 12B) to the memory 11 are performed via the input circuit 260 (or 261), the write amp circuit 270 (or 271), and the write buffer circuit 280 (or 281). On the other hand, data reads from the memory 11 to the logic portion 12A (or 12B) are performed via the output circuit 210 (or 211), the amp circuit 220 (or 221), and the preamp circuits 230 and 231.

According to this embodiment, as the distance between the memory cell 251 and the separation portion 13A can be shortened even further, the data read/write times between the separation portion 13A and the memory cell 251 can be reduced yet even further. Consequently, the switching cycle of the logic portions 12A and 12B can be shortened yet even further, and even higher-speed read/write memory access operations can be achieved effectively.

As explained above, according to the present invention, after wafer processing using the same exposure masks has been performed for a semiconductor integrated circuit that contains a memory such as a DRAM, and a plurality of logic portions such as microprocessors and ASICs, only the required logic portion of the plurality of logic portions is connected to the memory, and by separating the non-required logic portion(s) from the memory, it is possible to switch it to various system LSIs. This improves the productivity of semiconductor integrated circuits.

Alternatively, by providing a plurality of logic portions that have the same function, it is possible to recover a logic portion by substituting a failed logic portion with another logic portion that has integrity. This improves the yield of semiconductor integrated circuits.

With these features of the present invention, the cost of manufacturing semiconductor integrated circuits can be greatly reduced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising:
   a memory;
   a plurality of logic portions that are connectable to the memory and respectively carry out data processing; and
   a separation portion that connects at least one of the plurality of logic portions to the memory while separating the other logic portion(s) from the memory,
   wherein the separation portion comprises a plurality of programmable elements for connecting and separating the logic portion(s) to and from the memory, each of the plurality of programmable elements having an operational state which is either a connection state or a separation state, and the operational state of each of the plurality of programmable elements being determined during a manufacturing process.

2. The semiconductor integrated circuit according to claim 1, wherein the plurality of logic portions have different functions; and the separation portion connects a logic portion that has a function required by the semiconductor integrated circuit to the memory.

3. The semiconductor integrated circuit according to claim 1, wherein the plurality of logic portions have the same function; and of the plurality of logic portions, the separation portion connects to the memory a logic portion that has integrity.

4. The semiconductor integrated circuit according to claim 1, wherein the plurality of programmable elements comprise a plurality of fuse circuits arranged between the memory and the respective plurality of logic portions; and a fuse of the fuse circuits that corresponds to the other logic portion(s) is severed.

5. The semiconductor integrated circuit according to claim 4, wherein the severance of the fuse of the fuse circuits is accomplished in a process of redundancy-based recovery of memory in a manufacturing process of the semiconductor integrated circuit.

6. The semiconductor integrated circuit according to claim 1, wherein the plurality of programmable elements comprise a plurality of antifuse circuits arranged between the memory and the respective plurality of logic portions; and an antifuse of the antifuse circuits that corresponds to one of the logic portions is in a conductive state, while another antifuse of the antifuse circuits that corresponds to the other logic portion(s) is in a nonconductive state.

7. A semiconductor integrated circuit comprising:

a memory;

a plurality of logic portions that are connectable to the memory and respectively carry out data processing; and a separation portion that connects at least one of the plurality of logic portions to the memory while separating the other logic portion(s) from the memory, wherein the separation portion comprises switching circuits arranged between the memory and the plurality of logic portions; and each of the switching circuits, in regard to each logic portion, performs switching control in response to a received control signal, switching between a connected state, in which the corresponding logic portion and the memory are connected, and a separated state, in which the corresponding logic portion and the memory are separated.

8. The semiconductor integrated circuit according to claim 7, wherein the switching circuits are arranged between the memory and the respective plurality of logic portions, and comprise a plurality of transistor switches that, in response to the control signals, perform respective open/close operations; and each of the transistor switches realizes the connected state by closing, while realizing the separated state by opening.

9. The semiconductor integrated circuit according to claim 7, further comprising:

a control signal fixing circuit that fixes the control signal into either the connected state or the separated state.

10. The semiconductor integrated circuit according to claim 7, wherein at least one of the plurality of logic portions comprises:

a control circuit that judges whether or not said at least one logic portion is accessing the memory, and, based on the result of this judgment, outputs the control signal such that said at least one logic portion goes into either the connected state or the separated state.

11. The semiconductor integrated circuit according to claim 10, wherein the control circuit, when said at least one logic portion is not required by the semiconductor integrated circuit, outputs the control signal such that said at least one logic portion goes into the separated state.

12. The semiconductor integrated circuit according to claim 7, wherein at least one of the plurality of logic portions comprises:

a control circuit that, when judging that a logic portion other than said at least one logic portion is in an inoperative state, outputs the control signal such that the logic portion other than said at least one logic portion goes into the separated state.

13. The semiconductor integrated circuit according to claim 7, wherein the memory comprises a request signal generating circuit that outputs a request signal to at least one of the plurality of logic portions; and said at least one logic portion comprises:

a control circuit that judges an operative state of said at least one logic portion when the request signal is received and, based on the result of this judgment, outputs the control signal such that said at least one logic portion goes into either the connected state or the separated state.

14. The semiconductor integrated circuit according to claim 7, further comprising:

a test circuit that determines the integrity of each logic portion and outputs a determination signal based on the result of this determination to said each logic portion;

wherein at least one of the plurality of logic portions is provided with:

a control circuit that receives the determination signal, and, when the determination signal indicates that said at least one logic portion lacks integrity, outputs the control signal such that said at least one logic portion goes into the separated state.

15. The semiconductor integrated circuit according to claim 7, further comprising:

a test circuit that determines the integrity of each logic portion and outputs the control signal such that a logic portion determined to be lacking integrity goes into the separated state.

16. A semiconductor integrated circuit comprising:

A semiconductor integrated circuit comprising:

a memory;

a plurality of logic portions that are connectable to the memory and respectively carry out data processing;

a separation portion that connects at least one of the plurality of logic portions to the memory while separating the other logic portion(s) from the memory; and a power source separation circuit that separates the logic portion that is in a separated state from the power source supplied to that logic portion.

17. A semiconductor integrated circuit comprising:

a memory;

a plurality of logic portions that are connectable to the memory and respectively carry out data processing;

a separation portion that connects at least one of the plurality of logic portions to the memory while separating the other logic portion(s) from the memory; and a substrate voltage changing circuit that, in order to lessen the difference between a power source voltage supplied to a logic portion in the separated state and the substrate voltage of the corresponding logic portion, changes the corresponding substrate voltage.

18. A semiconductor integrated circuit comprising:

a memory;

a plurality of logic portions that are connectable to the memory and respectively carry out data processing; and a separation portion that connects at least one of the plurality of logic portions to the memory while separating the other logic portion(s) from the memory, wherein the separation portion selectively connects, of the plurality of logic portions, a used logic portion, which is used by the semiconductor integrated circuit, to the memory, while separating from the memory an unused logic portion, which is a logic portion other than the used logic portion.

19. The semiconductor integrated circuit according to claim 18, wherein the logic portions can be selectively connected to an output circuit inside the memory; and the separation portion is arranged between the output circuit and the logic portions, connecting the used logic portion to the output circuit, while separating the unused logic portion from the output circuit.

20. The semiconductor integrated circuit according to claim 18, wherein the memory has a plurality of output circuits respectively corresponding to the plurality of logic portions;

the logic portions can be selectively connected to an amp circuit inside the memory via the respective corresponding ones of the output circuits; and the separation portion is arranged between the amp circuit and the output circuits, connecting the used logic portion to the amp circuit, while separating the unused logic portion from the amp circuit.

21. The semiconductor integrated circuit according to claim 18, wherein the memory has a plurality of output circuits and a plurality of amp circuits respectively corresponding to the plurality of logic portions;

the logic portions can be selectively connected to a preamp circuit inside the memory via the respective corresponding ones of the output circuits and amp circuits; and the separation portion is arranged between the preamp circuit and the amp circuits, connecting the used logic portion to the preamp circuit, while separating the unused logic portion from the preamp circuit.

22. The semiconductor integrated circuit according to claim 18, wherein the memory has a plurality of output circuits, a plurality of amp circuits, and a plurality of preamp circuits respectively corresponding to the plurality of logic portions;

the logic portions can be selectively connected to a sense amp circuit inside the memory via the respective corresponding ones of the output circuits, amp circuits, and preamp circuits; and the separation portion is arranged between the sense amp circuit and the preamp circuits, connecting the used logic portion to the sense amp circuit, while separating the unused logic portion from the sense amp circuit.

23. The semiconductor integrated circuit according to claim 18, wherein the logic portions can be selectively connected to an input circuit inside the memory; and the separation portion is arranged between the input circuit and the logic portions, connecting the used logic portion to the input circuit, while separating the unused logic portion from the input circuit.

24. The semiconductor integrated circuit according to claim 18, wherein the memory has a plurality of input circuits respectively corresponding to the plurality of logic portions;

the logic portions can be selectively connected to a write amp circuit inside the memory via the respective corresponding ones of the input circuits; and the separation portion is arranged between the write amp circuit and the input circuits, connecting the used logic portion to the write amp circuit, while separating the unused logic portion from the write amp circuit.

25. The semiconductor integrated circuit according to claim 18, wherein the memory has a plurality of input circuits and a plurality of write amp circuits respectively corresponding to the plurality of logic portions;

the logic portions can be selectively connected to a write buffer circuit inside the memory via the respective corresponding ones of the input circuits and write amp circuits; and the separation portion is arranged between the write buffer circuit and the write amp circuits, connecting the used logic portion to the write buffer circuit, while separating the unused logic portion from the write buffer circuit.

26. The semiconductor integrated circuit according to claim 18, wherein the memory has a plurality of input circuits, a plurality of write amp circuits, and a plurality of write buffer circuits respectively corresponding to the plurality of logic portions;

the logic portions can be selectively connected to a sense amp circuit inside the memory via the respective corresponding ones of the input circuits, write amp circuits, and write buffer circuits; and the separation portion is arranged between the sense amp circuit and the write buffer circuits, connecting the used logic portion to the sense amp circuit, while separating the unused logic portion from the sense amp circuit.

* * * * *